(12) United States Patent
Wu et al.

(10) Patent No.: US 7,745,274 B2
(45) Date of Patent: Jun. 29, 2010

(54) GATE SELF ALIGNED LOW NOISE JFET

(75) Inventors: Xiaoju Wu, Irving, TX (US); Fan-Chi Frank Hou, McKinney, TX (US); Pinghai Hao, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 649 days.

(21) Appl. No.: 11/715,748

(22) Filed: Mar. 8, 2007

(65) Prior Publication Data

US 2008/0217664 A1 Sep. 11, 2008

(51) Int. Cl.
*H01L 29/80* (2006.01)
*H01L 21/335* (2006.01)

(52) U.S. Cl. .................. 438/195; 438/186; 438/196; 438/526; 438/595; 257/E21.445; 257/E21.446

(58) Field of Classification Search ............... 257/287, 257/504, E21.445, E21.446, 270, 365; 438/186–196, 438/526, 595, 238
See application file for complete search history.

(56) References Cited

U.S. PATENT DOCUMENTS

| | | | |
|---|---|---|---|
| 4,214,215 A | | 7/1980 | Mellen et al. |
| 5,012,305 A | * | 4/1991 | Khadder et al. ............. 257/270 |
| 5,120,669 A | * | 6/1992 | Schrantz ..................... 438/186 |
| 5,192,699 A | * | 3/1993 | Bulat et al. .................. 438/192 |
| 5,498,885 A | * | 3/1996 | Deen et al. ................... 257/139 |
| 5,786,615 A | | 7/1998 | Saito |
| 6,790,736 B2 | * | 9/2004 | Wu ............................. 438/316 |
| 7,648,898 B2 | * | 1/2010 | Banna ......................... 438/585 |
| 2002/0175383 A1 | | 11/2002 | Kocon et al. |
| 2005/0067631 A1 | | 3/2005 | Pendharker et al. |
| 2008/0014687 A1 | * | 1/2008 | Vora et al. ................... 438/186 |
| 2008/0093635 A1 | * | 4/2008 | Kobayashi ................... 257/256 |
| 2008/0272402 A1 | * | 11/2008 | Saha et al. ................... 257/256 |

* cited by examiner

*Primary Examiner*—Kiesha R Bryant
*Assistant Examiner*—Eric Ward
(74) *Attorney, Agent, or Firm*—Warren L. Franz; Wade J. Brady, III; Frederick J. Telecky, Jr.

(57) ABSTRACT

The disclosure herein pertains to fashioning a low noise junction field effect transistor (JFET) where transistor gate materials are utilized in forming and electrically isolating active areas of a the JFET. More particularly, active regions are self aligned with patterned gate electrode material and sidewall spacers which facilitate desirably locating the active regions in a semiconductor substrate. This mitigates the need for additional materials in the substrate to isolate the active regions from one another, where such additional materials can introduce noise into the JFET. This also allows a layer of gate dielectric material to remain over the surface of the substrate, where the layer of gate dielectric material provides a substantially uniform interface at the surface of the substrate that facilitates uninhibited current flow between the active regions, and thus promotes desired device operation.

22 Claims, 8 Drawing Sheets

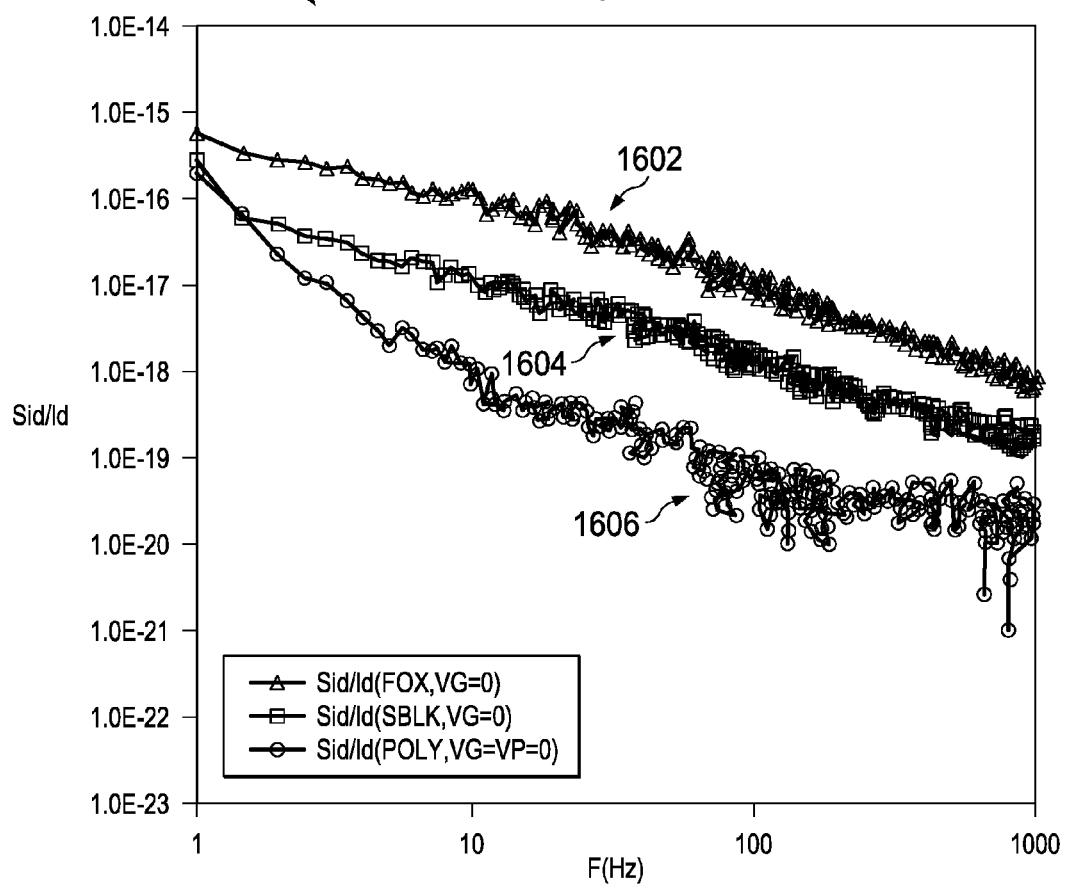

GATE SELF ALIGNED LOW NOISE JFET

FIELD

The disclosure herein relates generally to semiconductor processing, and more particularly to fashioning a low noise junction field effect transistor (JFET).

BACKGROUND

It can be appreciated that different electronic devices may have different requirements depending upon a particular device's application. For example, high performance precision analog applications may require very low noise, simple yet precise component matching, high speed and long term matching stability. In addition to demanding low component noise and precise component matching, precision analog products also require that operations of critical components be reliable and un-modulated by other undesired sources such as overlying conducting metal buses. It would, therefore, be desirable to fashion transistors that operate with low noise, good matching and high disturbance immunity characteristics.

It can also be appreciated that transistors are basic building blocks of semiconductor circuitry and electronic devices. Accordingly, the type of transistor used depends upon the applications and the characteristics of the transistor. For example, junction field effect transistors (JFETs) generally exhibit very low 1/f noise and high input impedance. Complementary metal oxide semiconductor (CMOS) transistors, on the other hand, operate with a relatively higher level of noise and have a high impedance or low input current. Bipolar transistors, in contrast, accommodate good matching and low noise but exhibit a low impedance or a high input current. Given the desire for low noise in high performance precision analog applications and the propensity for JFET transistors to operate with low noise, it would thus be desirable to produce a JFET in a cost effective manner that allows the JFET to operate with even lower noise so that the JFET can be implemented in a high performance precision analog application.

SUMMARY

The following presents a summary to provide a basic understanding of one or more aspects of the disclosure herein. This summary is not an extensive overview. It is intended neither to identify key or critical elements nor to delineate scope of the disclosure herein. Rather, its primary purpose is merely to present one or more aspects in a simplified form as a prelude to a more detailed description that is presented later.

The disclosure herein pertains to fashioning a low noise junction field effect transistor (JFET) where transistor gate materials are utilized in forming and electrically isolating active areas of the JFET. More particularly, active regions are self-aligned with patterned gate electrode material and sidewall spacers which facilitate desirably locating the active regions in a semiconductor substrate. This mitigates the need for additional materials in the substrate to isolate the active regions from one another, where such additional materials can introduce noise into the JFET. This also allows a layer of gate dielectric material to remain over the surface of the substrate, where the layer of gate dielectric material provides a substantially uniform interface at the surface of the substrate that facilitates uninhibited current flow between the active regions, and thus promotes desired device operation.

To the accomplishment of the foregoing and related ends, the following description and annexed drawings set forth certain illustrative aspects. Other aspects, advantages and/or features may, however, become apparent from the following detailed description when considered in conjunction with the annexed drawings.

BRIEF DESCRIPTION OF THE DRAWINGS

FIG. 16 is a graph illustrating respective normalized noise spectra density plots for differently configured junction field effect transistors.

DETAILED DESCRIPTION OF THE INVENTION

Figure 1:
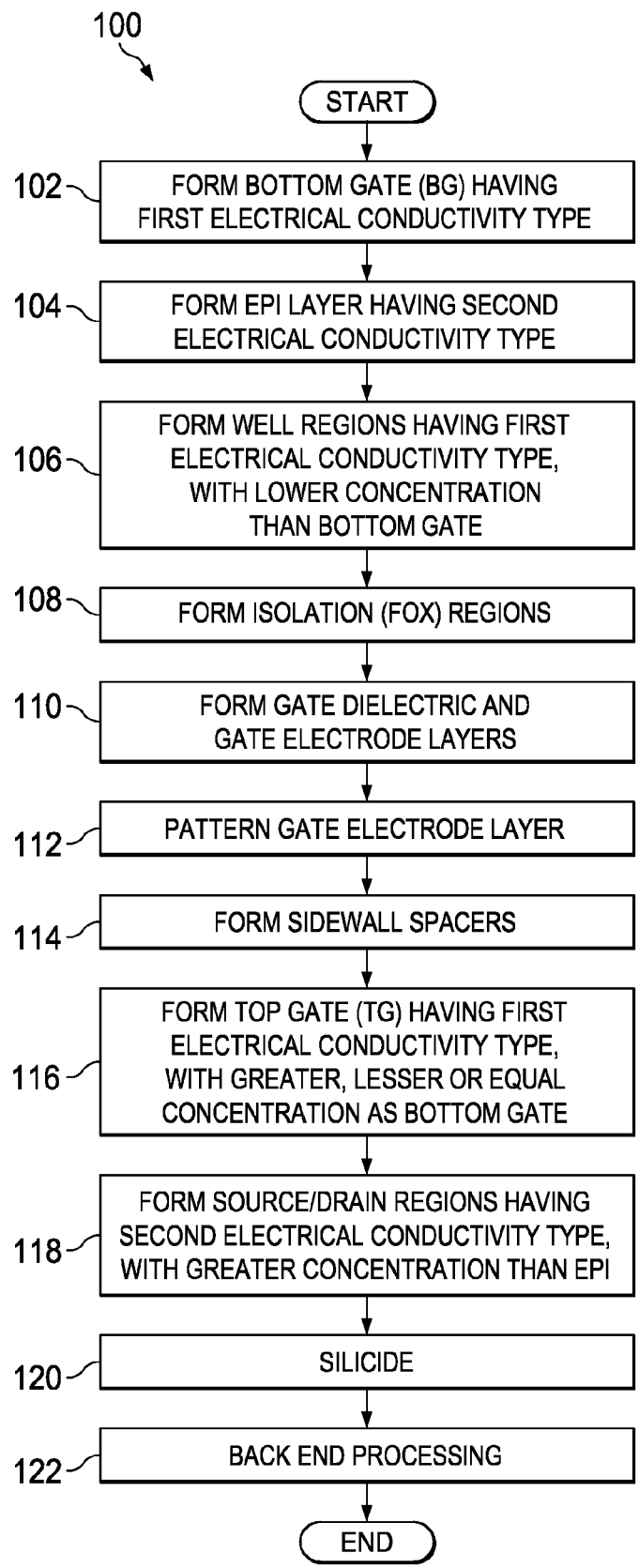
FIG. 1 is a flow diagram illustrating an exemplary methodology for forming a junction field effect transistor (JFET).

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

An exemplary methodology 100 for forming a junction field effect transistor (JFET) is illustrated in FIG. 1, and FIGS. 2-15 are primarily cross-sectional views of a semiconductor substrate 200 wherein such a method is implemented. While the method 100 is illustrated and described below as a series of acts or events, it will be appreciated that the illustrated ordering of such acts or events is not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Further, one or more of the acts depicted herein may be carried out in one or more separate acts and/or phases. Further, one or more of the acts depicted herein may be carried out in one or more separate acts and/or phases.

Figure 2:
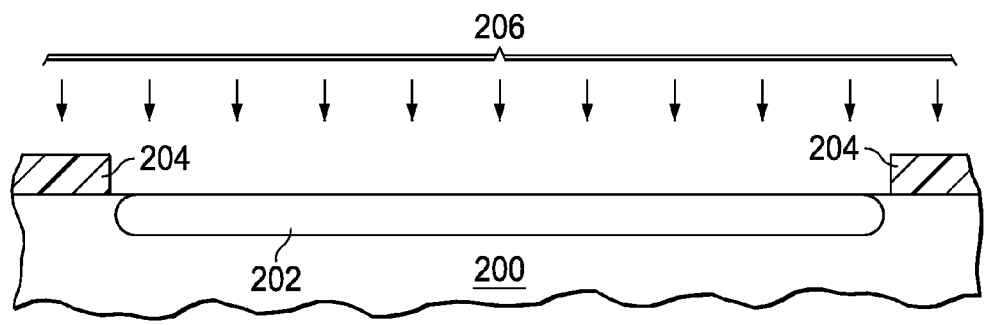
FIGS. 2-12 are cross-sectional views of a semiconductor substrate wherein an exemplary JFET is formed.

At the outset, a back or bottom gate (BG) region 202 having a first electrical conductivity type (e.g., p or n type) is formed in the semiconductor substrate 200 at 102 (FIG. 2). The BG 202 can be formed, for example, by forming and patterning a first resist 204 over the substrate 200 and performing a first (selective) implantation 206 of one or more dopants into the substrate 200. It will be appreciated that substrate as referred to herein may comprise any type of semiconductor body (e.g., silicon, SiGe, SOI) such as a semiconductor wafer or one or more die on a wafer, as well as any other type of semiconductor and/or epitaxial layers formed thereon and/or otherwise associated therewith. It will also be appreciated that the patterning of the first resist 204 (as with all masking and/or patterning mentioned herein) can be performed in any suitable manner, such as with lithographic techniques, for example, where lithography broadly refers to processes for transferring one or more patterns between various media. In lithography, a light sensitive resist coating (e.g., 204) is formed over one or more layers to which a pattern is to be transferred. The resist coating is then patterned by exposing it to one or more types of radiation or light which (selectively)

passes through an intervening lithography mask containing the pattern. The light causes exposed or unexposed portions of the resist coating to become more or less soluble, depending on the type of resist used. A developer is then used to remove the more soluble areas leaving the patterned resist. The patterned resist can then serve as a mask for the underlying layer or layers which can be selectively treated (e.g., doped).

Figure 3:
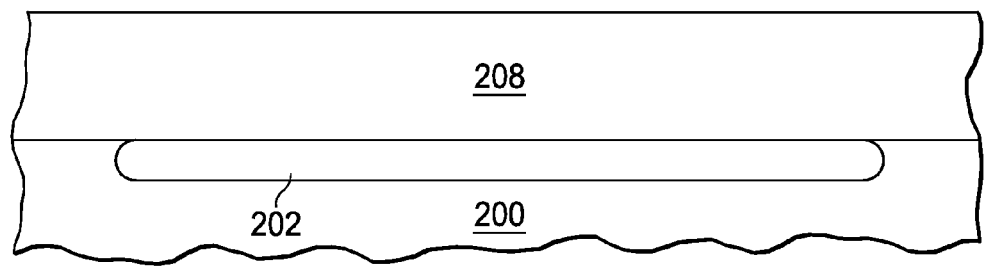
Figure 4:
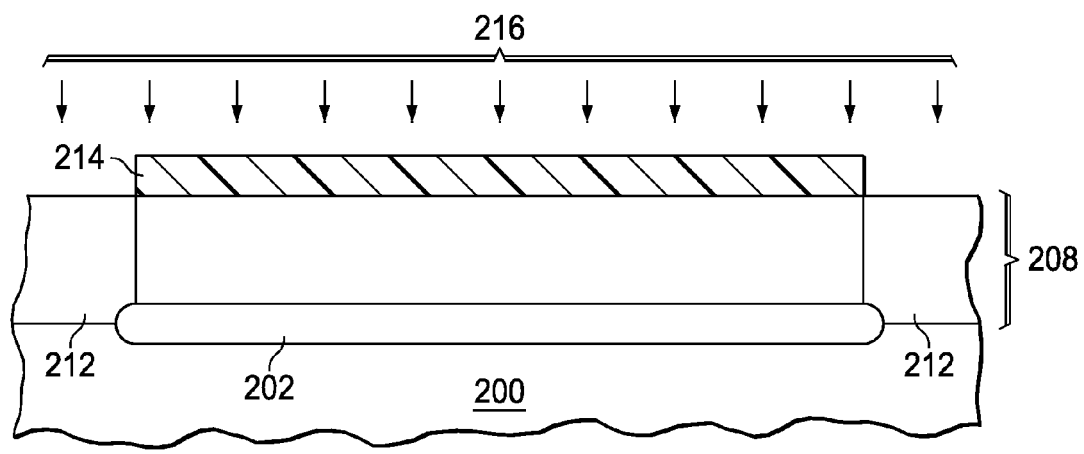

At 104, an epitaxial or EPI layer 208 having a second electrical conductivity type (e.g., n or p type) is formed (e.g., grown) over the surface of the substrate 200 (FIG. 3). At 106, well regions 212 having the first electrical conductivity type are (selectively) formed within the EPI layer 208 down to the BG 202 (FIG. 4). The well regions 212 may be formed, for example, with a second patterned resist 214 and a second implantation 216. It will be appreciated that the workpiece may be subjected to elevated temperatures during the epitaxial growth process, and such elevated temperatures may cause the BG 202, or rather the dopants thereof, to migrate upward into the EPI layer 208 as illustrated in FIG. 4. Additionally, the well regions 212 are formed to have a dopant concentration that is lower than the concentration of the BG 202. FIG. 4 illustrates an example arrangement wherein the well regions 212 are located at laterally opposite ends of the bottom gate region 202.

Figure 5:
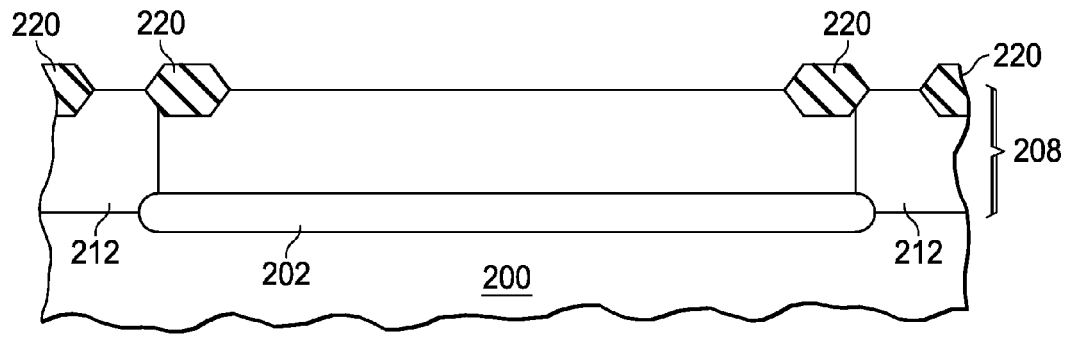

Isolation regions 220 are then formed in the EPI layer 208 at 108 to electrically isolate different active areas from one another (FIG. 5). The isolation regions 220 can comprise LOCOS (local oxidation of silicon) FOX (field oxide) regions and/or STI (shallow trench isolation) regions, for example. To implement LOCOS isolation regions, for example, a hardmask (e.g., of $Si_3N_4$) (not shown) may be formed over the EPI layer 208 and patterned so that underlying areas where the isolation regions are to be formed are exposed. Then, one or more dopants (e.g., Boron) can be implanted into these exposed areas to form channel stops that mitigate the formation of inversion layers which could create undesirable conductive channels between adjacent devices. A relatively thick (e.g., around 500 nm) oxide pad (e.g., $SiO_2$) is then grown in the exposed areas, where the hardmask inhibits such growth in locations other than these areas. Due to its thickness, the oxide is formed relatively quickly by a wet growth process to keep the fabrication process timely. The hardmask is then removed, leaving the LOCOS or FOX isolation regions.

Figure 6:
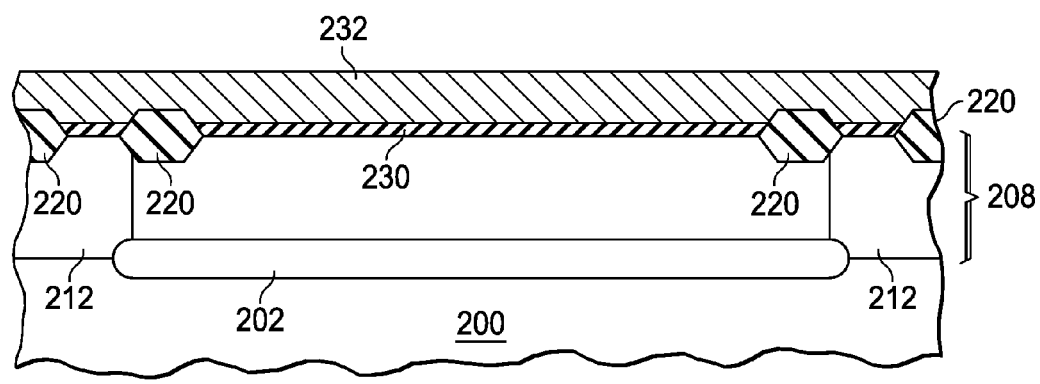

At 110, a layer of gate dielectric material 230 is formed over the EPI layer 208 and a layer of gate electrode material 232 is formed over the layer of gate dielectric material 230 (FIG. 6). The layer of gate dielectric material 230 generally comprises an oxide (or other dielectric) based material and/or a high-k material, for example, and is relatively thin, being formed to a thickness of between about 1 nm and about 20 nm, for example. The layer of gate dielectric material 230 is generally formed relatively slowly by a dry growth process so that it is of a high quality and substantially uniform. The layer of gate electrode material 232 generally comprises a polysilicon (or other semiconductor) based material, and is formed to a thickness of between about 150 nm and about 300 nm, for example.

Figure 7:
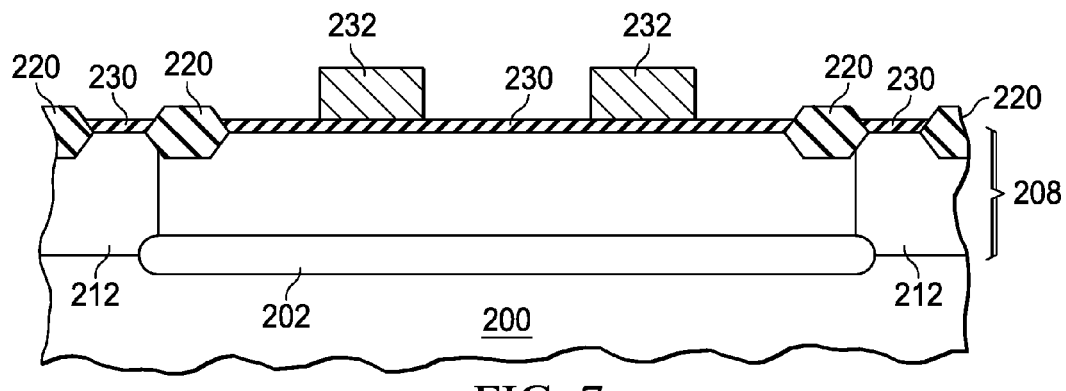
Figure 8:
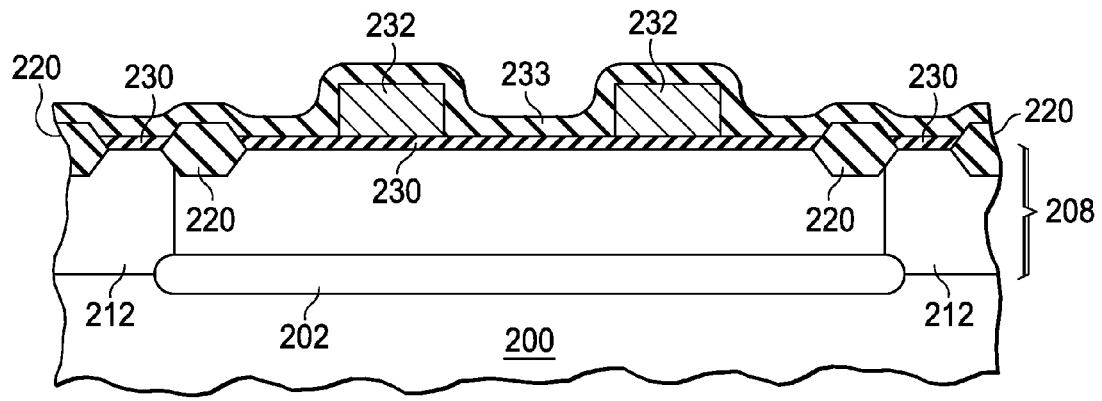
Figure 9:
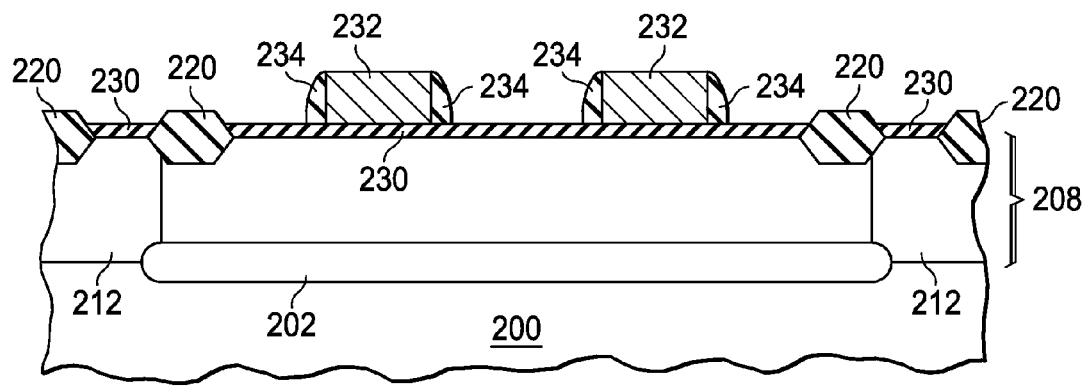

The layer of gate electrode material 232 is then patterned at 112 stopping on the gate dielectric material structures 230 (FIG. 7). At 114, sidewall spacers 234 are formed on the sides of the patterned gate electrode material 232. Such sidewall spacers 234 can be formed, for example, by conformally forming a layer of dielectric material 233 over the patterned gate electrode material 232 (FIG. 8) and anisotropically etching said material so that it merely remains on the sides of the patterned gate electrode material 232 (FIG. 9).

Figure 10:
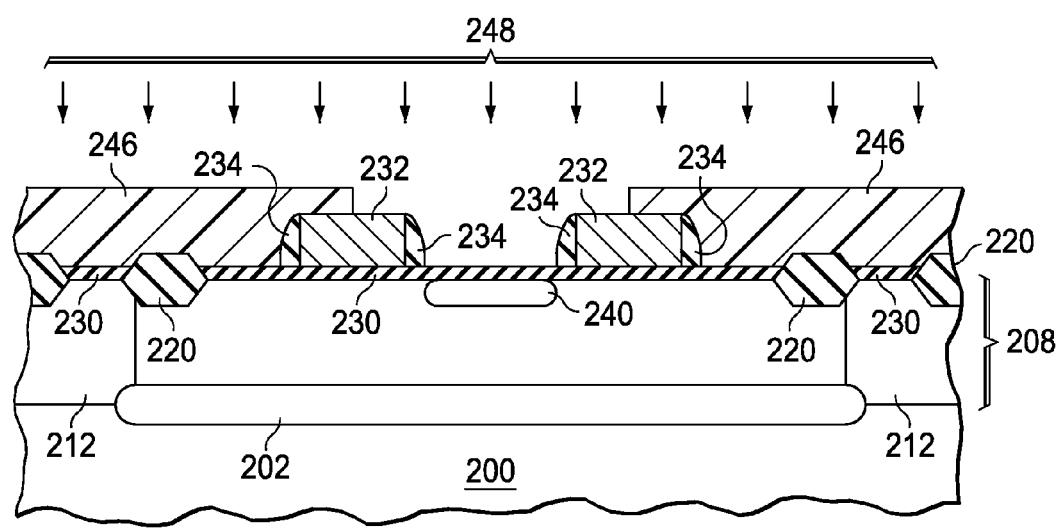
Figure 11:
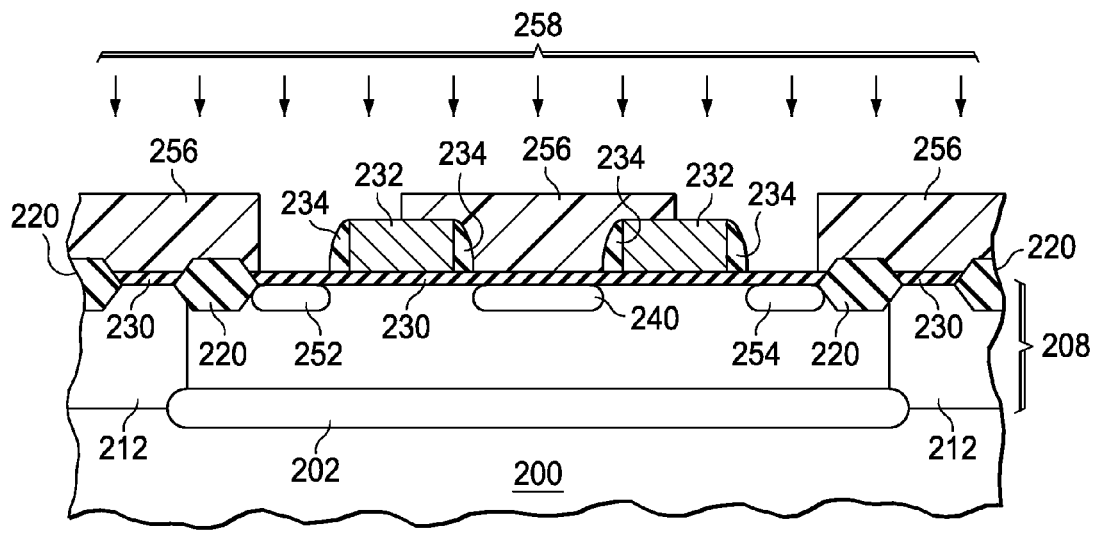

At 116, a top gate region 240 having the first electrical conductivity is then formed in the EPI layer 208 (FIG. 10). The top gate 240 may be formed, for example, with a third patterned resist 246 and a third implantation 248. Additionally, the top gate 240 can have a dopant concentration that is greater, lesser or equal to the concentration of the BG 202. Source 252 and drain 254 regions having the second electrical conductivity type are then similarly formed in the EPI layer 208 at 118, such as with a fourth patterned resist 256 and a fourth implantation 258 (FIG. 11). The source 252 and drain 254 regions are formed to have a dopant concentration that is greater than the concentration of the EPI layer 208. In the illustrated example, the source 252 and drain 254 regions are substantially equidistant from the top gate 240—due to the uniformity of the patterned gate electrode material 232. It will be appreciated, however, that the spacing between the active regions 240, 252, 254 can be any suitable dimensions. FIG. 11 illustrates an example arrangement wherein the top gate region 240 is formed between facing sidewall spacers 234 of two patterned gate electrode material structures 232, and the source 252 and drain 254 regions are formed respectively between non-facing sidewall spacers 234 and the well regions.

Figure 12:
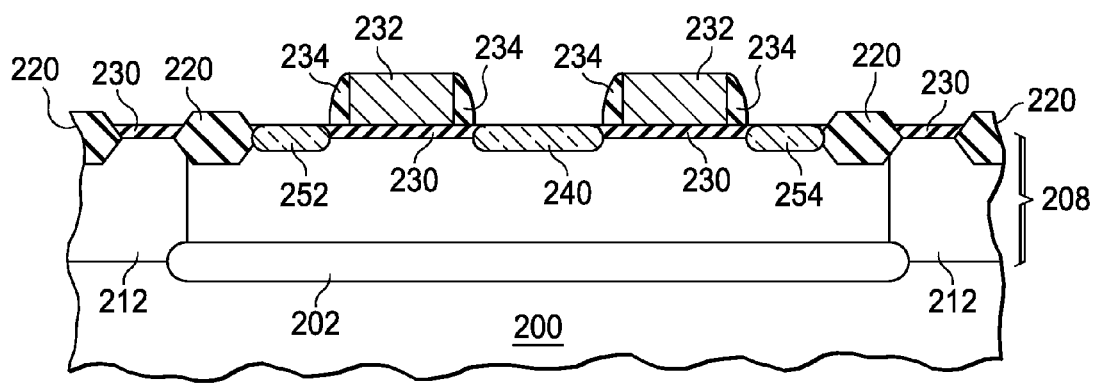

At 120, a silicidation process is performed to form silicides in/on the active regions 240, 252, 254 (FIG. 12). More particularly, an annealing or sintering process is performed to establish metal alloys from the EPI layer 208 and some of the dopants that were implanted into the EPI layer 208 in forming the active regions. The silicides serve as contacts for the active regions 240, 252, 254. Further back end processing can then be performed at 122 where one or more conductive and/or dielectric layers can be formed and/or treated in some manner (e.g., etched, doped, etc.), and the method 100 ends thereafter.

Figure 13:
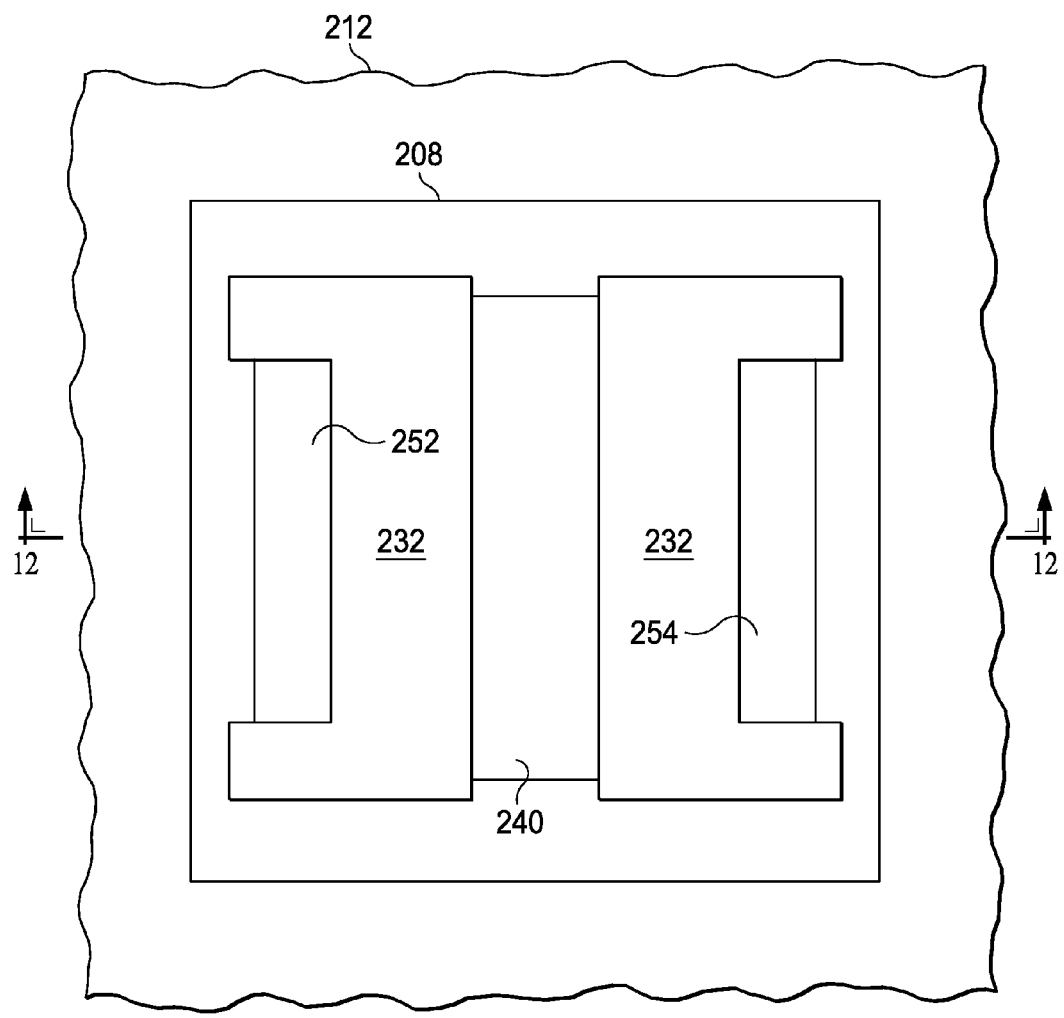
FIG. 13 is a top view of a semiconductor substrate wherein an exemplary JFET is formed, where a cross section taken along lines 12-12 of FIG. 13 may correspond to the device illustrated in FIG. 12.
Figure 14:
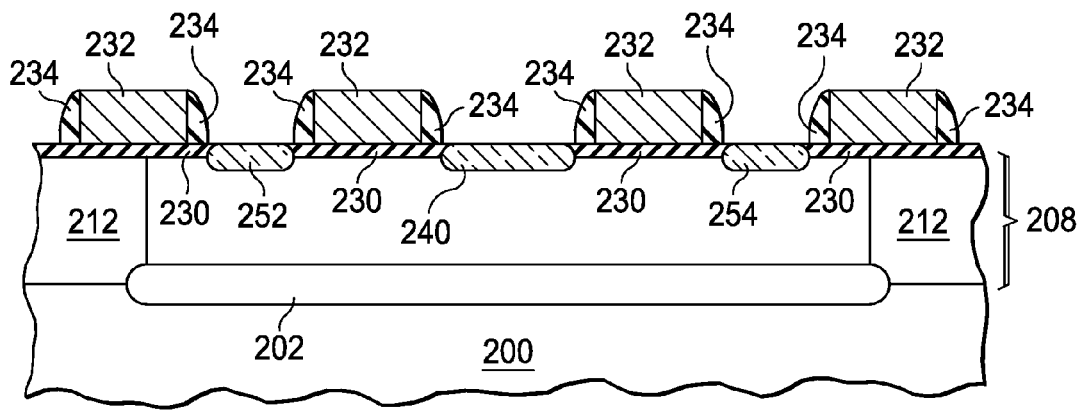
FIG. 14 is a cross-sectional view of a semiconductor substrate wherein an exemplary JFET is formed.
Figure 15:
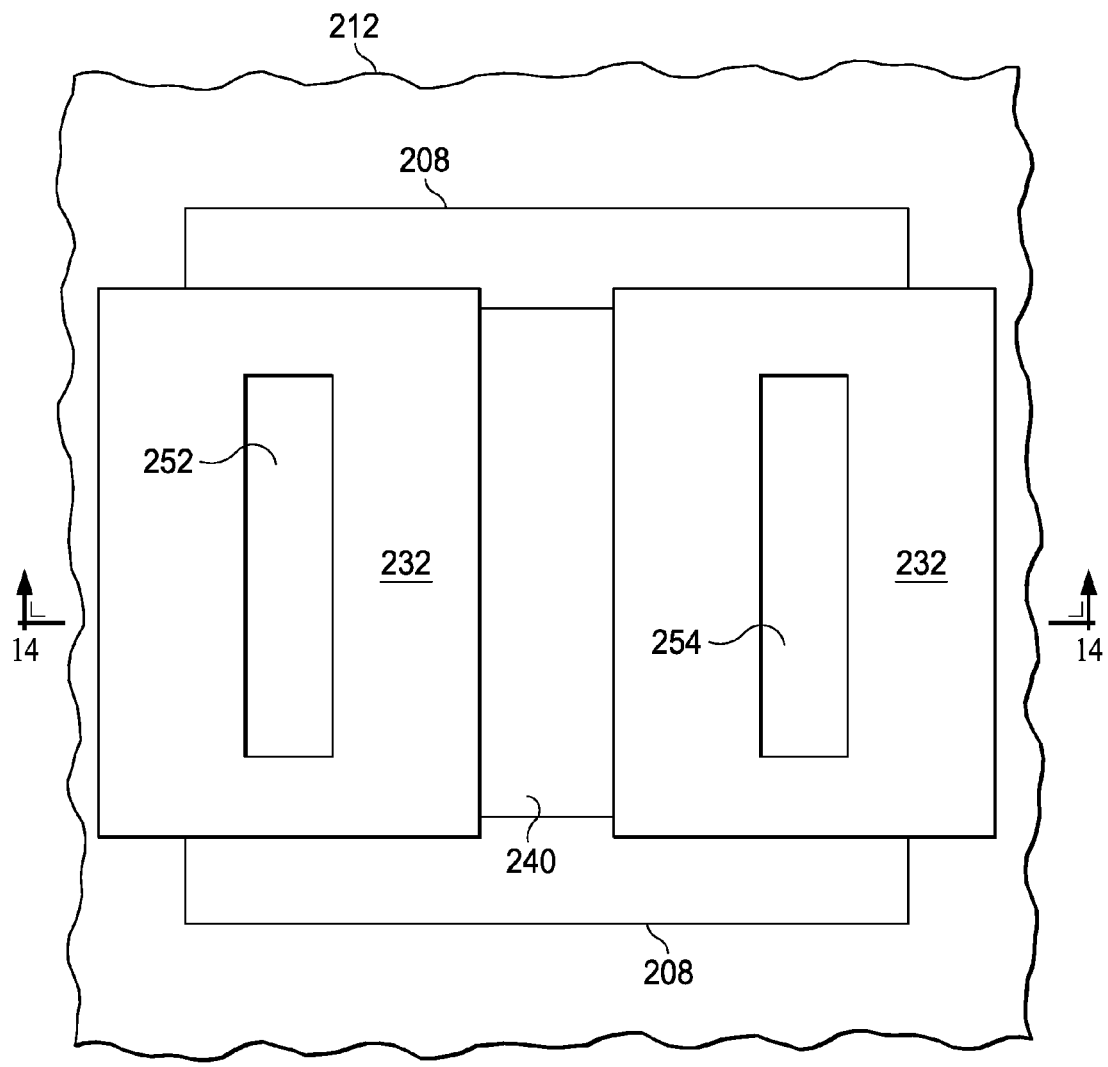
FIG. 15 is a top view of a semiconductor substrate wherein an exemplary JFET is formed, where a cross section taken along lines 14-14 of FIG. 15 may correspond to the device illustrated in FIG. 14.

FIG. 13 is a top view of an exemplary JFET, where a cross section taken along lines 12-12 of FIG. 13 may correspond to the device illustrated in FIG. 12. It will be appreciated that the isolation regions 220, sidewall spacers 234 and layer of gate dielectric material 230 are not depicted in FIG. 13 (or FIG. 15) for simplicity. It can thus be appreciated that the JFET, and more particularly the gate electrode material 232, can be patterned into a variety of different configurations while still producing a low noise JFET. By way of further example, FIG. 14 is a cross-sectional view of a JFET where at least some of the isolation regions 220 are replaced by patterned gate electrode material structures 232 and sidewall spacers 234 such that the source 252 and drain 254 regions are surrounded by patterned gate electrode material structures 232 and sidewall spacers 234. FIG. 14 illustrates an example arrangement wherein the top gate, source and drain regions are formed in self-alignment between respective different pairs of facing sidewalls of adjacent patterned gate electrode material structures 232. Note that the degree of overlap between the patterned gate electrode material 232 and sidewall spacers 234 and the well regions 212 may be exaggerated in FIG. 14. FIG. 15 is a top view of an exemplary JFET, where a cross section taken along lines 14-14 of FIG. 15 may correspond to the device illustrated in FIG. 14. This further illustrates possible variations with regard to fashioning a low noise JFET as described herein.

It will be appreciated that fashioning a JFET as described herein also allows a low noise (1/f) JFET to be produced in a cost effective manner. For example, the active regions 240, 252, 254 are self-aligned with the sidewall spacers 234 on the patterned gate electrode material 232 (e.g., because the sidewall spacers 234 and patterned gate electrode material 232 block dopants and thus inhibit the implantation of dopants thereunder). This self-alignment serves to form the active regions 240, 252, 254 at locations that are sufficiently separate from one another (so that regions 240, 252, 254 don't interact/influence one another). Further, the dielectric sidewall spacers 234 serve to isolate the active regions from the patterned gate electrode material 232. In this manner, shorting between the silicided active regions 240, 252, 254 and the conductive gate electrode material 232 is mitigated.

Additionally, since the active regions 240, 252, 254 are formed at desired locations within the EPI layer 208, additional materials are not needed in the EPI layer 208 to isolate the active regions 240, 252, 254 from one another, where such materials can introduce noise into the JFET. By way of example, the transistor operates, at least in part, by conducting a current between the active regions 240, 252, 254 when appropriate voltages are applied thereto. Accordingly, inserting dielectric materials into the EPI layer 208 between the active regions 240, 252, 254 would impede current flow between these regions. For example, growing FOX 220 between the regions 240, 252, 254 would place a non-conductive oxide in the current path. Moreover, FOX is (wet) grown relatively quickly to keep the fabrication process timely. This produces a lower quality oxide, however, that possesses non-uniformities or irregularities that can further interrupt or otherwise disturb current flow and thus the (anticipated) operation of the device. Similarly, forming silicide block dielectric materials in the EPI layer 208 to separate the active regions 240, 252, 254 from one another would again impede current flow. Moreover, silicide block dielectric materials may exhibit (unintended) variations because they are not self-aligned and thus may provide inconsistent current paths that would again adversely affect the (anticipated) operation of the device.

Also, while a surface shield (not shown) could be formed near the surface of the EPI layer 208 to force current to conduct a little lower in the EPI layer 208 to avoid such FOX or silicide block materials, this would add time and expense to the fabrication process because forming such a surface shield would necessitate additional masking and implantation activities. The patterned gate electrode 232 discussed herein provides a control mechanism to achieve the same effect without the associated cost. More particularly, a bias voltage can be applied to the patterned gate electrode 232 to push the current away from the surface of the EPI layer 208 to promote a reduction in noise (1/f).

It can thus be appreciated that since additional materials are not needed in the EPI layer 208 to isolate the active regions 240, 252, 254 from one another (because the active regions 240, 252, 254 are self-aligned with the sidewall spacers 234 on the patterned gate electrode material 232 and are thus sufficiently separated from one another), the layer of gate dielectric material 230 can remain over the surface of the EPI layer 208. This is advantageous because the gate dielectric material generally comprises a high quality (e.g., oxide) material that is formed (e.g., grown) by a relatively slow (dry) process. This high quality material thus provides a substantially uniform interface at the surface of the EPI layer 208 which facilitates uninhibited current flow (e.g., low 1/f noise) between the active regions 240, 252, 254, and thus promotes desired device operation. The layer of gate dielectric material 230 also helps to mitigate out diffusion of dopants (e.g., from active regions 240, 252, 254 and well regions 212) from the surface of the EPI layer 208. Additionally, as mentioned above, the patterned gate electrode 232 provides another degree of freedom for noise mitigation by allowing current to be pushed away from the surface of the EPI layer 208.

FIG. 16 is a graph 1600 illustrating normalized noise spectra or a noise spectra density plot for a JFET with FOX separating active regions 1602, with silicide block material separating active regions 1604, and with active regions merely self-aligned with gate electrode material 1606. Frequency is plotted on the X axis of the graph, while current noise density normalized to current is plotted on the Y axis. The Sid/Id plotted on the Y axis is the current noise divided by drain current or current noise normalized for drain current. This is noise density from source to drain. It can be seen that a JFET with FOX separating active regions 1602 experiences the most noise (e.g., due to FOX impeding the path of current flow), while a JFET with active regions that are self-aligned with gate electrode material 1606 as described herein experiences the least noise (e.g., due to substantially uninhibited current flow).

It will be appreciated that fashioning a JFET as described herein can be readily integrated into a standard CMOS fabrication process. For example, the first, second, third and fourth patterned resists and corresponding implantations mentioned herein can be borrowed from or implemented with existing masking and implantation actions that are part of a standard CMOS fabrication process. Similarly, the layer of gate dielectric material 230 and layer of gate electrode material 232 are standard layers used in CMOS fabrication to form gate stacks of CMOS transistors (e.g., gate electrodes overlying gate dielectrics). Additionally, the illustrated ordering of acts or events disclosed herein can be varied. For example, the top gate 240 can be formed before the isolation regions 220 (or at any other time in the process flow) (e.g., by making use of/adapting earlier masking and doping activities). Fashioning a JFET as part of a standard CMOS fabrication process thus allows the JFET to be produced in a cost effective manner, which satisfies an ongoing desire in semiconductor fabrication.

While reference is made throughout this document to exemplary structures in discussing aspects of methodologies described herein (e.g., those structures presented in FIGS. 2-15 while discussing the methodology set forth in FIG. 1), those methodologies are not to be limited by the corresponding structures presented. Rather, the methodologies (and structures) are to be considered independent of one another and able to stand alone and be practiced without regard to any of the particular aspects depicted in the drawings. Additionally, layers described herein, can be formed in any suitable manner, such as with spin-on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein. Further, some regions that are illustrated as having distinct or abrupt edges may not be so precisely delineated, but may instead blend slightly with other regions. This is particularly true of doped or implanted regions that may diffuse with other regions, particularly at abutting edges.

What is claimed is:

1. A method of forming a junction field effect transistor (JFET), comprising:
   forming a bottom gate region having a first electrical conductivity type in a semiconductor substrate;
   forming an epitaxial layer having a second electrical conductivity type over the semiconductor substrate;

forming well regions having the first electrical conductivity type in the epitaxial layer down to the bottom gate region;

forming a layer of gate dielectric material over the epitaxial layer;

forming a layer of gate electrode material over the layer of gate dielectric material;

patterning the layer of gate electrode material to form a plurality of patterned gate electrode material structures over the epitaxial layer over the bottom gate region;

forming sidewall spacers adjacent to the patterned gate electrode material structures;

forming a top gate region having the first electrical conductivity type in the epitaxial layer over the bottom gate region, in self-alignment between ones of the sidewall spacers of adjacent ones of the patterned gate electrode material structures; and forming source and drain regions having the second electrical conductivity type in the epitaxial layer over the bottom gate region, in self-alignment with respective other ones of the sidewall spacers of the patterned gate electrode material structures, the top gate region being situated between the source region and the drain region.

2. The method of claim 1, further comprising siliciding the top gate region and the source and drain regions.

3. The method of claim 1, wherein dopant concentration of the source and drain regions is greater than dopant concentration of the epitaxial layer.

4. The method of claim 2, wherein dopant concentration of the source and drain regions is greater than dopant concentration of the epitaxial layer.

5. The method of claim 1, wherein dopant concentration of the well regions is lower than dopant concentration of the bottom gate region.

6. The method of claim 2, wherein dopant concentration of the well regions is lower than dopant concentration of the bottom gate region.

7. The method of claim 3, wherein dopant concentration of the well regions is lower than dopant concentration of the bottom gate region.

8. The method of claim 4, wherein dopant concentration of the well regions is lower than dopant concentration of the bottom gate region.

9. The method of claim 8, wherein forming the layer of gate dielectric material comprises forming an oxide based material by a substantially dry growth process.

10. The method of claim 9, wherein the oxide based material is formed to a thickness of between about 1 nm and about 20 nm.

11. The method of claim 10, wherein the source and drain regions, the top gate region, the patterned gate electrode material and the sidewall spacers are situated between the well regions.

12. The method of claim 11, the source and drain regions are substantially equidistant from the top gate region.

13. A method of forming a junction field effect transistor (JFET), comprising:

forming a bottom gate region having a first electrical conductivity type in a semiconductor substrate;

forming an epitaxial layer having a second electrical conductivity type over the semiconductor substrate;

forming first and second well regions having the first electrical conductivity type at spaced apart locations in the epitaxial layer down to the bottom gate region;

forming a layer of gate dielectric material over the epitaxial layer;

forming a layer of gate electrode material over the layer of gate dielectric material;

patterning the layer of gate electrode material to form first and second patterned gate electrode material structures over the epitaxial layer over the bottom gate region, between the first and second well regions;

forming sidewall spacers on sides of the first and second patterned gate electrode material structures;

forming a top gate region having the first electrical conductivity type in the epitaxial layer over the bottom gate region, between facing ones of the sidewall spacers of the first and second patterned gate electrode material structures; and forming a source region having the second electrical conductivity type in the epitaxial layer over the bottom gate region, between a non-facing one of the sidewall spacers of the first patterned gate electrode material structure and the first well region; and forming a drain region having the second electrical conductivity type in the epitaxial layer over the bottom gate region, between a non-facing one of the sidewall spacers of the second patterned gate electrode material structure and the second well region.

14. The method of claim 13, wherein dopant concentration of the first and second well regions is lower than dopant concentration in the bottom gate region; and dopant concentration of the source and drain regions is greater than dopant concentration in the epitaxial layer.

15. The method of claim 13, wherein the first and second wells are located at laterally opposite ends of the bottom gate region.

16. The method of claim 13, further comprising forming silicided contacts for the drain, source and top gate regions.

17. The method of claim 13, wherein patterning the layer of gate electrode material includes also forming third and fourth patterned gate electrode material structures respectively adjacent to the first and second well regions and with at least portions over the epitaxial layer and over the bottom gate region; the source region is formed between the first and third patterned gate electrode material structures; and the drain region is formed between the second and fourth patterned gate electrode structures.

18. The method of claim 17, wherein the third and fourth patterned gate electrode material structures are formed with other portions respectively situated over the first and second well regions.

19. The method of claim 17, wherein forming sidewall spacers includes also forming sidewall spacers on sides of the third and forth patterned gate electrode material structures; the source region is formed between facing ones of the sidewall spacers of the first and third patterned gate electrode material structures; and the drain region is formed between facing ones of the sidewall spacers of the second and fourth patterned gate electrode structures.

20. The method of claim 19, wherein the top gate region, the source region and the drain region are respectively formed in self-alignment between different adjacent ones of the sidewall structures.

21. The method of claim 20, wherein the first and second wells are located at laterally opposite ends of the bottom gate region.

22. The method of claim 21, wherein the third and fourth patterned gate electrode material structures are formed with other portions respectively situated over the first and second well regions.

* * * * *